FABRICATION OF SEMICONDUCTIVE DEVICES

Filed June 20, 1955 2 Sheets-Sheet 1

INVENTORS C.S. FULLER
M. TANENBAUM
BY
Arthur J. Torsiglieri
ATTORNEY

Nov. 18, 1958 C. S. FULLER ET AL 2,861,018

FABRICATION OF SEMICONDUCTIVE DEVICES

Filed June 20, 1955 2 Sheets-Sheet 2

INVENTORS C. S. FULLER
M. TANENBAUM

BY Arthur J. Torsiglieri

ATTORNEY

United States Patent Office 2,861,018

Patented Nov. 18, 1958

2,861,018

FABRICATION OF SEMICONDUCTIVE DEVICES

Calvin S. Fuller, Chatham, and Morris Tanenbaum, Plainfield, N. J., assignors to Bell Telephone Laboratories, Incorporated, New York, N. Y., a corporation of New York Application June 20, 1955, Serial No. 516,674

7 Claims. (Cl. 148—1.5)

This invention relates to the manufacture of semiconductive devices, and more particularly relates to methods for the fabrication of silicon bodies for use in semiconductive devices.

It will be convenient to discuss the invention with reference specifically to its application to silicon because of its primary importance to such end, although its principles may be extended to other semiconductors.

Although silicon is an element which in electronic structure is well suited for use as a semiconductor in many applications, an obstacle to more widespread use of it for such purposes has been the difficulty in working with high purity single crystal silicon for adapting it for use in semiconductive devices without deteriorating its quality. It is characteristic of silicon prepared in a form for use in a semiconductive device by the usual techniques that it provides a high recombination rate or relatively low lifetime to minority carriers injected into it. This means that its efficiency is low for applications like that in a junction transistor in which minority carriers are injected into the base zone from the emitter for diffusion to the collector, since if the base zone is of low lifetime material most of the minority carriers injected will recombine in the base zone and never arrive at the collector. If low lifetime material is to be used for the base zone, it becomes of increasing importance to insure that the thickness of the base zone is small to minimize the time the minority carriers are in the base zone and so the probability that they will recombine there and not arrive at the collector. Accordingly, if semiconductive bodies of silicon are to be used in applications where low recombination of minority carriers is important, it is necessary to put increased emphasis on the control of the location and geometry of p–n junctions which define the control zones of importance.

An important object of the present invention is to facilitate control of the location and geometry of p–n junctions in a semiconductive body, to the end that closely spaced p–n junctions may be provided in the body for defining an intermediate zone of one conductivity type in a body of opposite conductivity type.

A specific object of the present invention is to make feasible the large scale manufacture of silicon junction transistors suitable for operation at high frequencies, typically up to at least fifty megacycles.

It will be helpful by way of example to discuss particularly the application of the general principles of the present invention with specific reference to the fabrication of junction transistors, the object of special interest. Junction transistors are described in United States Patent 2,623,102, which issued to W. Shockley on December 23, 1952. In a silicon junction transistor, it is desirable that the thickness of the base zone be thin for several reasons. First, as discussed above, because of the relatively poor lifetime likely to be characteristic of the silicon body, a thin base zone is necessary to a high alpha where alpha, as is customary in the art, denotes the fraction of the current injected across the emitting junction which successfully diffuses across the collecting junction. Moreover, as also known to workers in the art, a thin base zone is desirable for good high frequency response since the transit time of the minority carriers in diffusing across the base must ordinarily be small compared to the period of the signal.

As is discussed more fully in a copending application Serial No. 496,202, filed March 23, 1955 and having the same assignee as this application in the fabrication of junction transistors it has been found advantageous for increased control to form the base zone by vapor-solid diffusion techniques. To this end, a semiconductive body of one conductivity type is heated in the vapor of an appropriate conductivity type determining impurity and a thin surface region of the body is changed to the opposite conductivity type by the diffusion therein of the impurity. Subsequently, a selected portion of the surface of this diffused region is reconverted to its original conductivity type. As a consequence, there remains of the diffused region of opposite conductivity type a surface portion which is exposed and to which the base connection is subsequently made and a portion which is intermediate between the bulk of the body and the reconverted surface portion. This intermediate portion which lies between regions of the one conductivity type serves as the base zone.

It has now been found that this process may be considerably simplified, especially for use with silicon as the semiconductor. In particular, it is found that by appropriate choice of diffusants and suitable control, it is possible to avoid the need for leaving exposed at the surface of the semiconductive body a portion of the diffused region of opposite conductivity type for making the base connection. More particularly, it is made feasible to form by vapor-solid diffusion multiple layers of different conductivity type over the whole surface of the silicon body and thereafter to make a base connection to an intermediate one of the multiple layers by simply alloying with a suitable material through a selected part of a surface to penetrate to or completely through the desired intermediate layer. By this expedient for forming the base connection, there is avoided both the need for any masking during diffusion and the necessity for critical positioning or close control of the depth of penetration of the connection to the intermediate layer, and, as a consequence, the fabrication of junction transistors is considerably expedited.

To this end, it is in accordance with one feature of the invention to control the concentrations of impurities in the surface portion and the bulk portion which are of the one conductivity type and to alloy in from the surface for penetrating to or through the intermediate region with a material which provides a low resistance non-rectifying connection to the intermediate region but a high resistance rectifying connection to the surface and bulk portions.

Moreover, because the last-mentioned feature makes it unnecessary to leave exposed a region of the opposite conductivity type, it has become advantageous to provide for the formation of the surface portion of the one conductivity type and the intermediate region of the opposite conductivity type essentially in a single diffusion step. To this end, it is characteristic of the preferred embodiment of the invention to heat the silicon body in the presence both of a donor and an acceptor for the simultaneous diffusion into the silicon body of the donor and acceptor whereby in the one step a thin intermediate region of one conductivity type is formed between the bulk portion of the silicon body and the surface portion of opposite conductivity type. In particular, in accordance with the present invention, the diffusant which is to be predominant in the intermediate region is chosen to have at the heating temperature used to promote diffusion a diffusivity in silicon higher than that of the impurity which is to be predominant in the surface zone.

Accordingly, by appropriate choice of diffusants having suitable diffusivities, intermediate regions of prescribed thicknesses may be readily formed in a single diffusion simply by control of the temperature and time of diffusion. However, when simultaneous diffusion of two impurities is used it is also important that the more slowly diffusing impurity, which is to be predominant in the surface portion, have a solubility in silicon at the heating temperature higher than that of the faster diffusing impurity, which is to be predominant in the intermediate region, so that the former impurity will in fact predominate in a surface layer. The simultaneous diffusion of both donor and acceptor impurities is facilitiated by the use as the diffusion source of a compound which includes both acceptor and donor atoms and which will dissociate in the silicon to permit separate diffusion of the acceptor and donor atoms.

There are various other factors of importance. In particular, it is important to avoid having the emitter zone too thick. Thick emitter zones make more difficult the accurate control of the base zone thickness because of the differential nature of the process of forming the base zone. It is also found that a thin emitter zone results at the emitting junction in a distribution of significant impurities which resembles a step function and in the base zone a distribution which has a gradient suitable for providing a built-in electrostatic field, two results found desirable for better high frequency performance. Moreover, in high frequency units where lateral control of geometry is very important, a thick emitter zone makes difficult penetration therethrough without lateral spreading of the alloying material used for making the base connection. On the other hand, it is important to avoid having the emiter zone too thin, since high emitter efficiency important to a good transistor demands that the number of free carriers available for transistor action be much larger in the emitter zone than the base zone and the permissible concentration of free carriers in the emitter zone is limited by the necessity for penetration through the emitter zone for making the base connection. In the light of these considerations, it is found advantageous to have the emitter and base zones of comparable thicknesses i.e. not more than a two-to-one ratio in the two thicknesses.

To achieve emitter and base zones of comparable thicknesses in a single diffusion step, it is necessary that the diffusivities and the surface concentrations at the temperatures used of the two impurities be appropriately related. Alternatively, to the same end it is feasible when, because of other considerations two diffusants whose characteristics are not so related, are to be used, to employ a preliminary diffusion step in which only one diffusant is employed to compensate for any wide disparity in diffusivity rates.

From the foregoing discussion, it should be apparent that accurate control of the concentration of the impurity to be predominant in the emitter zone is of considerable importance. To facilitate such control, it is advantageous that the impurity to be predominant in the emitter zone be one whose equilibrium solubility in silicon at the diffusion temperatures used is such as to provide the desired concentration in the surface zone to obviate necessity for control of the vapor pressure of the impurity.

In particular, the various considerations discussed are found to be favorably met in the fabrication of an N P N silicon body when indium antimonide is chosen for use as the diffusion source and aluminum is used as the material for alloying through the antimony-rich surface zone for making connection to the indium-rich intermediate region. Alternatively, to the same end, it is also found feasible to employ either aluminum antimonide or gallium antimonide as the diffusion source and aluminum as the material for alloying through the antimony-rich or gallium-rich surface zone for making connection to the aluminum-rich intermediate zone. In such alternative processes, it is desirable to include a preliminary diffusion of antimony alone to avoid a large disparity in thicknesses of the surface and intermediate zones.

The choice of antimony as the diffusant to predominate at the emitter zone in an N P N transistor has unique advantages. The equilibrium solubility of antimony in silicon at temperatures at which the diffusion can conveniently be carried on is found to result in a concentration of acceptors in the surface zone which is sufficiently high to make for good emitter action for emitter thicknesses in the desired range but yet sufficiently low to permit alloying therethrough of the base connection with no undesirable effects. Moreover, the surface solubility in silicon of antimony at the operating temperatures is sufficiently higher than that of either gallium, aluminium or indium to overdope such acceptor in the surface region to make simultaneous diffusion feasible.

Additionally, the diffusivity of antimony in silicon is sufficiently low relative to that of aluminum, gallium and indium to make simultaneous diffusion feasible to permit formation of multiple layers. Although when used with aluminum as the impurity to be predominant in the base region, a preliminary diffusion step is found desirable if the emitter and base zones are to be of comparable thicknesses.

Indium, gallium and aluminum are suitable for use as the diffusant to predominate in the intermediate zone since each has a solubility in silicon at reasonable diffusion temperatures which result in an acceptor concentration in the intermediate region sufficiently high to make for a low base resistance, a desirable factor for good transistor operation. Each, moreover, forms with antimony a compound which is available in highly purified form and which will dissociate into acceptor and donor atoms in silicon.

Additionally, in conjunction with the choice of antimony as the diffusant to be predominant in the surface zone as discussed, aluminum offers special advantages for use as the alloying material for insuring a low resistance non-rectifying connection to the intermediate region but a high resistance rectifying connection to the surface zone. In particular, of special importance for high frequency units, aluminum may be alloyed through a selected portion of the surface zone to the intermediate region with an optimum of geometry control because of the superior wetting properties of aluminum on silicon.

In an illustrative two diffusion step embodiment of the invention to be discussed in detail, an n-type silicon body is first heated in the presence of antimony to provide an antimony-rich surface layer. This first diffusion step makes feasible better control of the depth of the surface zone which is to serve as the emitter as discussed. This is followed by a second heating of the silicon body in the presence of aluminum antimonide for a time that permits after dissociation the faster diffusing aluminum to diffuse deeper by a prescribed amount into the body than the antimony. As a consequence, there is formed in the body a region which is aluminum-rich and p-type intermediate between the n-type bulk interior and an antimony-rich n-type surface layer. Low resistance connection only to the intermediate p-type region is made by alloying an aluminum film through a selected portion of the front surface of the silicon body for penetration through the intermediate region. The n-type surface layer and the p-type intermediate region are removed by suitable techniques from the edges and back surface of the body and there is formed thereby an NPN sandwich of the silicon body with provision for connection to each of the three zones.

Moreover, there will be described in detail an alternative illustrative embodiment in which only a single diffusion step is employed for forming both the surface and intermediate zones. In this process, indium antimonide is used as the diffusion source for forming an antimony-rich surface zone and an indium-rich intermediate zone. In other respects, this process is similar to the two diffusion step process.

Moreover, the process outlined above makes feasible a unit of geometry particularly adapted for use at frequencies in the fifty megacycle range. In particular, by alloying aluminum in a closed band on one surface of the body for making the base connection and alloying a gold antimony connection to the portion of the surface layer bounded by the aluminum band for serving as the emitter connection, there is provided a novel configuration of improved characteristics.

The general principles of the invention are believed not to be necessarily limited to the particular choice of diffusants discussed above although, as indicated, such choice in the fabrication of an NPN structure facilitates the fabrication and results in an improved unit. The general principles of the invention will be better understood from the following more detailed description, taken in conjunction with the accompanying drawings, in which.

Figure 1A:
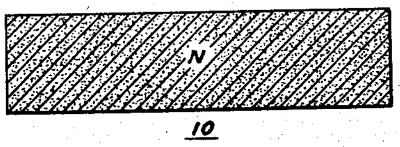
Figs. 1A through 1F show in various stages of its fabrication an NPN unit being processed in accordance with an illustrative embodiment of the invention.
Figure 1B:
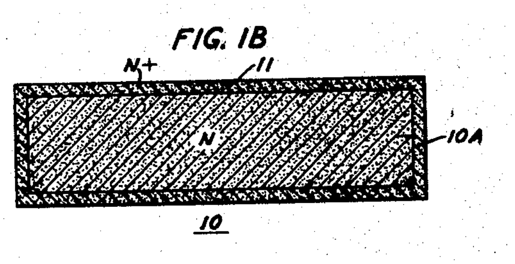
Figure 1C:
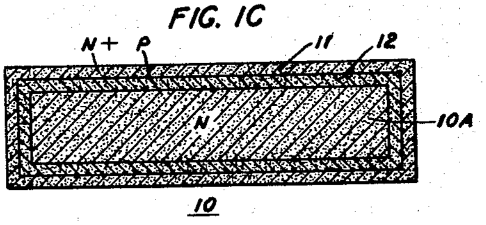

With reference now to a more complete description of illustrative embodiments of the invention, there will be described first a two step diffusion embodiment found particularly advantageous for the fabrication of an NPN body for use in a junction transistor suited for operation at high frequencies. Before diffusion, it is necessary to remove surface impurities and deformed surface material from the silicon body to be treated. Typically, such preliminary preparation comprises lapping the surface smooth on No. 600 silicon carbide paper, etching in a mixture of nitric and hydrofluoric acids, and rinsing thoroughly with distilled water. In Fig. 1A, there is shown an n-type silicon body 10 of approximately 4 ohm-centimeter resistivity, which is to be treated in accordance with the invention. Typically, the body may be 100 mils square with a thickness of 10 mils. For the first dicusion step, the silicon body is heated in a clean evacuated quartz oven in the presence of antimony oxide ($Sb_2O_3$) for about one and a quarter hours at 1250° C. to form a thin n+-type surface zone of resistivity lower than the bulk portion 10A of the body. In one specific form of the process which has been used successfully solid antimony oxide was used as a diffusion source and to this end was heated in an evacuated quartz tube together with but not in contact with a silicon wafer. It is found advantageous for avoiding too long diffusion times to operate above 1100° C. However, to minimize surface deterioration it is found desirable to operate below 1300° C. The temperature of 1250° C. is found to provide a good compromise. In Fig. 1B, there is shown after this first diffusion the silicon body characterized by an N+ surface portion 11. For the second diffusion, the silicon body is heated in a clean evacuated quartz oven in the presence of aluminum antimonide for about one-third of an hour again at a temperature of about 1250° C. In the embodiment successfully tested, solid indium antimonide was used as a diffusion source in the manner previously described for the use of solid antimony oxide as the diffusion source. Because of the higher diffusivity and lower solubility of aluminum, there results at the end of this second diffusion step a silicon body of the kind shown in Fig. 1C in which an aluminum-rich p-type intermediate region 12 exists between the n-type bulk 10A and the antimony-rich N+-type surface layer 11. Diffusion in the manner described is found to result in a silicon body well suited for use in a high frequency unit. The thickness of each of the two zones is estimated to be in the range between .1 and .2 mil. The maximum concentration of antimony in the surface zone is less than approximately $10^{19}$ atoms per centimeter $^3$ which appears to be the maximum concentration tolerable to permit the simplified base connection described which forms an important feature of the invention. Yet the antimony concentration is sufficiently high that the number of free carriers in the surface zone is sufficiently higher than the number of free carriers in the intermediate zone to make for a good emitter efficiency for the surface zone. Also, although both operating layers are close to the surface, no significant alloyage or other undesirable deterioration of the surface results from the diffusion steps described, which would mar the uniformity of the surface and make for poor reproducibility of characteristics from unit to unit.

Additionally, the diffusion steps recited make for an impurity gradient in the intermediate zone which provides the built-in electrostatic field previously discussed as advantageous.

For realizing fully the high frequency advantages made possible by the thin base layer in a junction transistor, the lateral geometries of the emitter, base and collector zones must also be controlled to keep the capacitances associated with the junctions low.

Figure 1D:
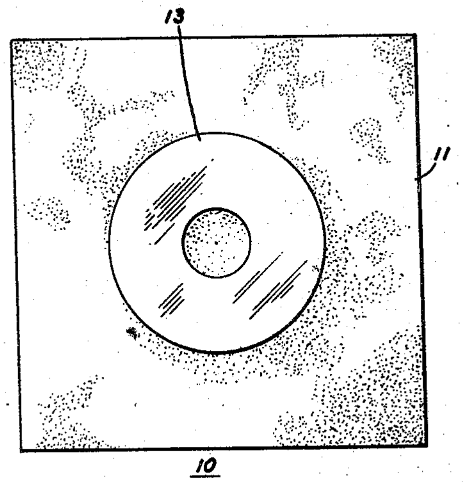
Figure 1E:
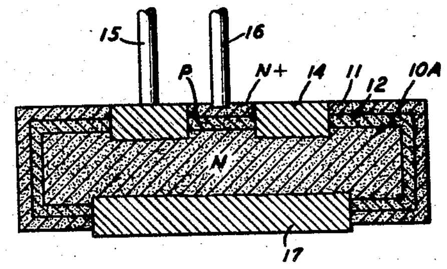

To this end, the following specific technique for making connection to the base zone and controlling the effective emitter area was found advantageous to the practice of the invention. First, there was evaporated a film of aluminum about one mil thick in the form of a band or ring having an outer diameter of about 30 mils and an inner diameter of about five mils on the front surface of the body. A top view of the front surface of the body with the aluminum film 13 thereon is shown in Fig. 1D. This can be done by well-known evaporation techniques, the cold silicon body after appropriate masking being exposed to aluminum vapor for a time sufficient to deposit a film of the specified thickness. The silicon body was then heated in a vacuum furnace for several minutes at a temperature above the silicon-aluminum eutectic, typically 800° C., to alloy the aluminum into the body for penetration completely through the thin antimony-rich surface layer 11 and the thin aluminum-rich intermediate region 12 and extending to the bulk portion 10A of the body. O course, no purpose is served by having the aluminum penetrate into the bulk portion except to insure penetration to the intermediate region 12. As previously described, the extent of penetration is immaterial so long only that it be sufficiently deep. In Fig. 1E, there is shown a cross section of the body 10 after alloyage of the aluminum film 13 as described to form the aluminum-rich ring 14 in the body. The base lead was then connected to this aluminum-rich band in conventional manner, as by bonding an aluminum wire 15 to the surface thereof.

For forming the emitter lead, a tungsten wire electrode 16, typically about two mils diameter, having one end coated with a gold-antimony (.01 Sb) alloy was brought to bear on the center of the surface portion 11 of the body enclosed by the aluminum-rich band and is bonded thereto as shown in Fig. 1E. Typically, the band was formed by passing a pulse of current through the electrode and the body for providing a localized temperature above the silicon gold eutectic. It is generally convenient to provide the current pulse by the discharge of a capacitor through a resistor in the manner known to workers in the art. It was important to limit the amount of gold-antimony coating on the electrode to insure that the band does not penetrate to the bulk portion 10A of the body and thereby short out the intermediate region which serves as the base. By limiting this coating on the end of the wire electrode 16 to a film about .1 mil thick there was insured the avoidance of excessive alloyage of the surface portion. The thickness of the film was fixed by control of the parameters of the electro-deposition process by which it was deposited in a manner known to workers in the art.

By the steps described for forming the base and emitter conections, the emitter area is effectively limited to that portion of the surface zone bounded by the aluminum-rich band 14 and the remaining portion of the surface is made inactive for transistor action. Moreover, the presence of this relatively wide aluminum-rich band will act to inhibit the formation of surface channels between the emitter and collector zones in the finished unit, the tendency to form such surface channels being a common failing of many transistors fabricated by other techniques. Moreover, the effect of surface recombination on minority carriers in the base layer is minimized since there is built in an electrostatic potential at the edge of the base layer which repels minority carriers from the free surface. Finally, as an additional advantage, since the band extends completely around the base region, the effective base resistance is low, as is desirable.

Conventional techniques may be employed for making connection to the bulk interior which serves as the collector zone. Typically, a kovar tab was alloyed to the back surface of the silicon body to penetrate to the bulk interior to provide the large area collector electrode 17 shown in Fig. 1E to which a wire lead 18 was soldered. To this end, the kovar tab on which was plated a film about one mil thick of a gold-antimony alloy (.01 Sb) was bonded to the back face of the silicon body by positioning the tab on a strip heater intermediate between the strip heater and the back face of the silicon body. The gold-antimony film thickness was enough to insure that the alloying would penetrate completely to the bulk portion for making a low resistance nonrectifying connection between the tab and the bulk. The strip heater was made to provide a temperature at the tab-body interface sufficient for alloying but insufficient for disturbing significantly the connections on the other face. A temperature of about 500° C. is typical. In many instances, it will be convenient to form the emitter and collector connections simultaneously since ordinarily the same temperature can be used in the alloying of the emitter and collector connections. The order in which the various connections are made is not ordinarily critical.

Figure 1F:
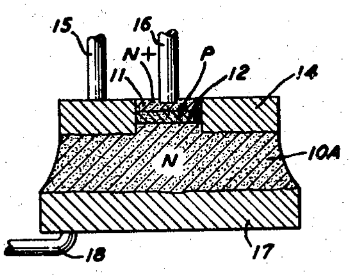

As a final cleaning up, the active portions of the front and back surfaces were suitably masked and the unit was dipped in an etch, such as CP–4, to remove the diffused material from the exposed portions of the body. There finally resulted a unit of the kind shown in Fig. 1F, which was encapsulated in the conventional manner.

Various modifications are feasible in the process which has been described in detail without departing from the basic teaching set forth.

First, as was indicated, the two diffusion steps are made necessary by the large difference in diffusivities in silicon of antimony and aluminum. The process just described was made a single diffusion process by the substitution of a single heating step. To this end, after the preliminary treatment described, the silicon body was heated for about one and a half hours in the presence of indium antimonide as a diffusion source in the manner described also at a temperature of approximately 1250° C. and there resulted a body of the type shown in Fig. 1C in which the N+-type surface zone 11 was antimony rich, the p-type intermediate region 12 indium rich, and the bulk portion 10A remained n-type as it was initially.

The remainder of the one diffusion step process may be as described for the two diffusion step process.

Figure 2A:
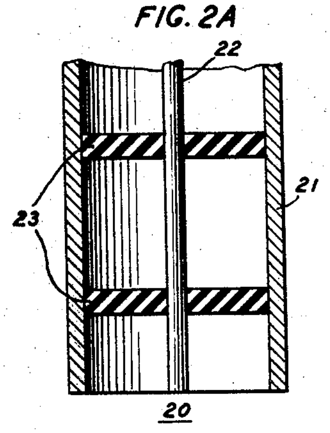
Fig. 2A shows a coaxial connector which can be used in connection with the process illustrated by Figs. 1A through 1F and Fig. 2B shows a unit including such a connector.

There may be made in the basic process described modifications which stem from differences in the operating range intended for the unit. For example, in units intended to have an upper frequency of operation of not much more than a megacycle, modifications can be incorporated which facilitate mass production. In particular, the easing of requirements on the avoidance of lateral spreading in making the emitter and base connections makes feasible a single step process for making the two connections by providing a coaxial assembly of the kind shown in cross section in Fig. 2A for making the connections. In this assembly, the outer member 21 comprises a hollow tube, either of aluminum or of a neutral metal, such as tin, which is coated with a relatively thick film of aluminum and the inner member 22 comprises a wire, typically of tungsten, one end of which is coated with a relatively thin gold-antimony alloy.

Figure 2B:
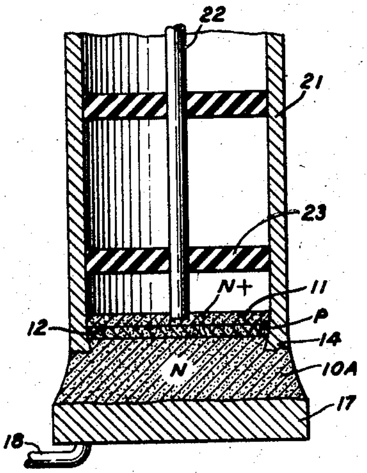

Moreover, in a low frequency unit of this kind, it is feasible to employ layers of larger thicknesses than in the high frequency unit previously described. The thicknesses of the operating layers may readily be controlled by the parameters of the diffusion process. Suitable dielectric spacers 23 maintain direct current isolation between the two members. The assembly is then positioned to have the coated end in pressure contact with the front surface of a silicon body of the kind shown in Fig. 1C and the unit is then heated to a temperature suited for bonding the assembly to the body. For the reasons previously discussed, the parameters are chosen to insure alloying of the outer member completely to the intermediate region and to avoid alloying the inner member to any part of the n-type bulk interior. In Fig. 2B, there is shown a completed unit which employs a coaxial assembly for making the emitter and base connections.

Figure 3A:
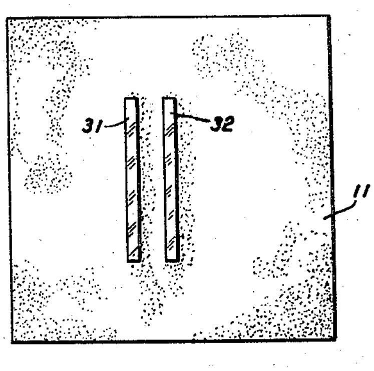
Figs. 3A and 3B show top and sectional views of a very high frequency unit at one stage of its fabrication in accordance with the invention.
Figure 3B:
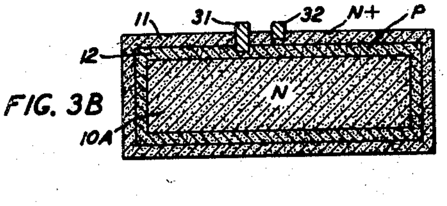
Figure 3C:
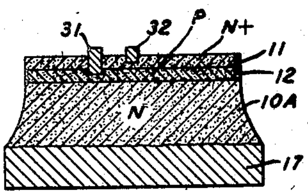
Fig. 3C is a sectional view of the unit at the end of the process.

Alternatively, in units intended for operation at frequencies of hundreds of megacycles, a somewhat different geometry for the emitter and base connections may be advantageous for reducing the stray capacitances. For such very high frequency units it is found preferable to form the emitter and base connections as parallel lines spaced apart about a mil. Figs. 3A and 3B show top and sectional views of a very high frequency unit. For forming the base connection, an aluminum line 31 about one mil wide and five mils long is evaporated on a front surface portion of a body of the type shown in Fig. 1C and is alloyed completely through to the intermediate region 12 as previously described. Then a gold-antimony line 32 of about the same dimensions is deposited on the front surface opposite the aluminum wire and about one mil apart and alloyed into the p-type surface zone as previously described. The considerations previously discussed with reference to the depth of penetration of the emitter and base connections similarly are applicable here. Wire leads bonded to the alloyed areas in the usual manner are provided for completing the connections. The connection to the collector zone may be made as before. Then for cleaning up, the area of the front surface encompassing the alloyed lines and the back surface are masked and the rest of the diffused material etched away. In Fig. 3C, there is shown the unit after etching.

For forming a very high frequency tetrode unit, the process just described may be modified to alloy a separate aluminum line on opposite sides of the gold-antimony line to provide to the intermediate aluminum-rich region 12 which is to serve as the base zone a pair of line connections spaced on opposite sides of the line emitter.

Additionally, in the fabrication of transistors for use at lower frequencies, the process described may be modified by the use simply of an aluminum wire, or a wire of a neutral metal, such as tungsten, which is aluminum coated, for making ohmic connection to the intermediate region. In this instance, the aluminum wire is positioned with an end making pressure contact with the silicon body and current may be passed through it and the body to alloy the wire to the body. In other respects, the process is as described, a portion of the front surface area surrounding the base and emitter connections being masked and the rest of the diffused material being removed by etching.

The first embodiment described in detail may be modified by the substitution of aluminum metal as the diffusion source in place of aluminum antimonide in the second diffusion step. However, as previously discussed ordinarily the use of aluminum antimonide is preferred because of the greater ease in obtaining it in high purity form. Moreover, the use of the compound is found to keep up the antimony concentration in the surface zone and insure good emitter action therefrom.

Moreover, in the interest of mass production, the necessary diffusion may be carried out in a continuous flow system in which the diffusants in a gaseous state and typically mixed with an inert carrier gas are passed continuously over the heated silicon body for the requisite diffusion time, for example, in apparatus of the kind described in copending application Serial No. 477,535, filed December 24, 1954 which issued on August 27, 1957, as United States Patent No. 2,804,405.

Alternatively, if some degree of control may be sacrificed, it is feasible to deposit the diffusants, for example, by evaporation, as films on the surface of the body in a first step and then as a second step to heat the body for effecting diffusion. In such instance, by proper control of the concentration of the individual diffusants, the desired thicknesses and concentrations of the layers may be realized. To facilitate control of the concentration of the diffusants, the diffusants may be applied in mixtures with inert materials. When any of these expedients are employed, precautions should be taken to avoid the formation of surface films of a kind which will make difficult the forming of emitter and base zone connections.

Moreover, while the particular elements described have been found advantageous in the fabrication of an NPN unit for the reasons set forth, considerable latitude is feasible in the choice of elements used.

For example, although aluminum alone has been described hitherto as the alloying acceptor material for making the simplified base connection, it is feasible to substitute another acceptor, such as indium, as the alloying acceptor material, particularly for low frequency units where lateral geometry is less critical.

Moreover, while antimony alone has been described hitherto as the donor for diffusion into the surface zone, a choice which well complements that of aluminum as the alloying agent, other donors such as arsenic and bismuth, which have a relatively low diffusivity in silicon are feasible. In these instances, group III—group V compounds such as the arsenides of aluminum and indium, and the bismuthide of indium may be used for the simultaneous diffusion of donors and acceptors into the silicon body. In particlar, it is unnecessary that the compound used be stoichiometric.

Control of the surface concentration of the donor to be predominant in the surface layer may be achieved in methods which diffuse from a gaseous state by adjusting the temperature of the diffusion source to adjust the vapor pressure of the diffusant since the surface concentration will ordinarily be related to the vapor pressure of the diffusant in the diffusion step described. In such cases by using an oven which has two temperature zones, the diffusion source and the silicon body may be kept at different temperatures during diffusion for an added degree of control.

In particular, for a high resistance rectifying junction at the interface between the alloy region used to make the base connection and the surface and bulk regions of opposite conductivity type, it is important that at least on one side of this interface or junction, the maximum concentration of uncompensated significant impurity atoms should be less than approximately $10^{19}$ atoms per centimeter $^3$.

As indicated above, when antimony is used in the manner described as the donor impurity which is to be predominant in the surface layer, the concentration of antimony in the surface layer meets this requirement. When either arsenic or phosphorus is used as the donor impurity, special precautions are necessary, such as control of its vapor pressure in gaseous diffusion or concentration when deposited as a film, to keep the concentration in the surface layer as low as is desirable.

It is feasible alternatively to use low resistivity surface layers and achieve the condition set forth above by adjustment of the concentration of impurities in the alloy region making connection to the intermediate layer. To such end, for use as the alloy material in making such connection, aluminum or indium may be diluted in an inert solvent, such as tin, which reduces its solubility in silicon and hence results in a lower uncompensated acceptor concentration in the alloy region. Alternatively, to this same end, an acceptor having a relatively low solubility in silicon, such as thallium, may be used for the alloying material and the mass of material used is adjusted to result in a regrowth region, adjacent the donor-rich surface layer, which is compensated to such an extent that there is satisfied the requirement discussed above for a high resistance rectifying junction at the interface of the alloy region making the base connection and the surface layer.

The discussion hitherto has been directed at junction transisors which employ an NPN silicon body as distinguished from a PNP body. The use of bodies of the former type is advantageous in high frequency units because of the greater mobility in silicon of electrons which form the active carriers in such bodies. However, the principles of the invention may be extended to the fabrication of junction transistors which employ PNP silicon bodies with appropriate modifications.

In particular, typically a gold-antimony alloy is suitable for use as the alloying material for making the omhic connection to the intermediate base region of the PNP body. Moreover, bismuth is a donor which has a relatively low solubility in silicon and so is in this respect suitable for use as the donor to be predominant in the intermediate base zone. To compensate for the relatively low rate of diffusion of bismuth in silicon, it ordinarily should be diffused in first and the acceptor which is to predominate in the surface zone diffused in subsequently. Such acceptor typically may be gallium, indium or aluminum. The temperatures and durations of the two diffusion steps should be adjusted to provide layers of appropriate thicknesses and concentrations as previously discussed. Alternatively, phosphorus as the donor and boron as the acceptor may be used as the diffusants by appropriate control of the temperatures, vapor pressures, and durations of the diffusion cycles for control of the surface concentrations of the diffusants during diffusion.

The principles of the invention may also be extended to be fabrication of silicon bodies for use in NPIN and PNIP junction transistors. In such instances one begins with a wafer which is of substantially intrinsic conductivity and provides thereon multiple layers in the manner described to form NPIPN or PNINP sandwiches. The emitter and base connections may be made on one face of the body as described. For making the collector connection, it is feasible either to grind off the multiple layers on the other face of the body and fuse in suitable material to form a collector zone of appropriate conductivity type or to fuse through the multiple layers to the bulk intrinsic interior overdoping the intermediate layers of the opposite conductivity type to form a collector zone of the desired conductivity type.

Additionally, the principles described may be extended to the fabrication of PNPN and NPNP silicon bodies. To such end there may be added another diffusion step or a fusion step to the process previously described.

Moreover, while the principles of the invention have been described with specific reference to silicon with which they have been found to be especially advantageous, they may readily be extended for use with other known semiconductive materials, such as germanium, germanium-silicon alloys and the group III–group V intermetallic compounds. In processing such other semiconductors, it will, of course, be necessary to vary the parameters and to choose the diffusants and alloying materials appropriately, but such modifications should be within the skill of the worker in the art in the light of the teaching set forth herein.

What is claimed is:

1. The process of fabricating a silicon semiconductive device which comprises the steps of heating a semiconductive silicon body in the presence of indium antimonide for the diffusion of indium and antimony into the body for forming therein a surface layer which is antimony rich and n-type and a layer intermediate between the interior portion of the body and said surface layer which is indium rich and p-type, and alloying aluminum over a selected portion of the surface of the body for forming an aluminum-rich region which overdopes a corresponding portion of the antimony-rich surface layer and penetrates to said indium-rich intermediate layer.

2. The process of claim 1 in which the body is of resistivity about one ohm-centimeter and is heated in the presence of indium antimonide for approximately one and one-half hour at a temperature of approximately 1250° C.

3. The process of fabricating a silicon semiconductive device which comprises the steps of heating a semiconductive silicon body in the presence of an antimonide of an acceptor taken from the group consisting of aluminum, gallium and indium for forming therein a surface layer which is antimony rich and n-type and a layer intermediate between the interior portion of the body and said surface layer which is acceptor rich and p-type, and alloying an acceptor over a selected portion of the surface of the body for forming an acceptor-rich region which overdopes a corresponding portion of the antimony-rich surface layer and penetrates to said acceptor-rich intermediate layer.

4. The process of fabricating a semiconductive device which comprises the steps of heating a semiconductive body of material taken from the group consisting of silicon, germanium, germanium-silicon alloys and group III—group V intermetallic compounds in the presence of an acceptor and a donor for their diffusion into the body for forming therein a surface layer in which one impurity predominates and a layer which is intermediate between the interior portion of the body and said surface layer and in which the other impurity predominates, and alloying a conductivity-type determining impurity of the type predominating in said intermediate layer over a selected portion of the surface of the body for forming a region in which said last impurity predominates which penetrates to the intermediate layer.

5. The process of fabricating a semiconductive device which comprises the steps of heating in turn a semiconductive body of material taken from the group consisting of silicon, germanium, germanium-silicon alloys and group III–group V intermetallic compounds in the presence of a first conductivity type determining impurity and a second conductivity type determining impurity of opposite conductivity type for forming a pair of contiguous layers of different conductivity type, and alloying a conductivity type determining impurity of the type predominating in the deeper of said contiguous layers for penetrating through the surface layer to said deeper layer.

6. The process of fabricating a semiconductive device which comprises the steps of heating a semiconductive body of material taken from the group consisting of silicon, germanium, germanium-silicon alloys and group III–group V intermetallic compounds in the presence of a compound including an acceptor and a donor, one of said two impurities having a diffusivity in the body which is higher than that of the other and a surface concentration in the body which is lower than that of the other for forming a surface layer in which the impurity of the lower diffusivity predominates and a layer intermediate between the interior portion of the body and said surface layer, and in which the impurity of the higher diffusivity predominates, and alloying an impurity of the type predominant in the intermediate layer over a selected portion of the surface of the body for penetration through to said intermediate layer.

7. The process of fabricating a silicon semiconductive device which comprises the steps of heating a silicon body in the presence of antimony for forming an antimony-rich surface layer, heating the body in the presence of aluminum antimonide for forming intermediate said surface layer and the bulk portion of the body a layer which is aluminum rich, and alloying aluminum over a selected portion of the surface of the body for forming an aluminum-rich region which penetrates through said antimony-rich surface layer to said aluminum-rich intermediate layer.

References Cited in the file of this patent

UNITED STATES PATENTS

| | | |
|---|---|---|
| 2,654,059 | Shockley | Sept. 29, 1953 |
| 2,689,930 | Hall | Sept. 21, 1954 |
| 2,701,326 | Pfann et al. | Feb. 1, 1955 |
| 2,705,767 | Hall | Apr. 5, 1955 |
| 2,717,343 | Hall | Sept. 6, 1955 |